United States Patent
Crowe et al.

(10) Patent No.: US 7,098,420 B2
(45) Date of Patent: Aug. 29, 2006

(54) ELECTRODE FOR USE WITH ATMOSPHERIC PRESSURE PLASMA EMITTER APPARATUS AND METHOD FOR USING THE SAME

(75) Inventors: Richard Crowe, Hazlet, NJ (US); Sergei Babko-Malyi, West Windsor, NJ (US); Kurt Kovach, Highlands, NJ (US); Seth Tropper, Old Bridge, NJ (US)

(73) Assignee: Plasmasol Corporation, Hoboken, NJ (US)

( * ) Notice: Subject to any disclaimer, the term of this patent is extended or adjusted under 35 U.S.C. 154(b) by 0 days.

(21) Appl. No.: 10/188,690

(22) Filed: Jul. 2, 2002

(65) Prior Publication Data

US 2003/0052096 A1 Mar. 20, 2003

Related U.S. Application Data

(60) Provisional application No. 60/302,890, filed on Jul. 2, 2001.

(51) Int. Cl.
*B23K 10/00* (2006.01)

(52) U.S. Cl. .............................. 219/121.43; 219/121.57

(58) Field of Classification Search ............ 219/121.43, 219/121.52, 121.47, 121.48, 121.5, 121.44; 313/582, 583, 586, 587, 231.41; 423/210, 423/245.1; 427/569; 118/723 E, 723 DC, 118/723 HC, 723 ER; 156/345.34, 345.43, 156/345.47, 345.33; 204/298.31, 298.39, 204/298.41, 192.11, 192.12, 192.34; 315/111.21, 315/111.81

See application file for complete search history.

(56) References Cited

U.S. PATENT DOCUMENTS

| | | | |
|---|---|---|---|
| 3,594,065 A | | 7/1971 | Marks |
| 3,831,052 A | * | 8/1974 | Knechtli ..................... 313/595 |
| 3,948,601 A | | 4/1976 | Fraser et al. |

(Continued)

FOREIGN PATENT DOCUMENTS

EP 1 084 713 A1 3/2001

(Continued)

OTHER PUBLICATIONS

Babko-Malyi, Sergei and Nelson, Gordon L., "Experimental Evaluation of Capillary Korona Dischargers", American Institute of Aeronautics and Astronautics, 30th Plasmadynamics and Lasers Conference: AIAA-99-3488 (Jun. 28-Jul. 1, 1999), pp. 1-14.

(Continued)

*Primary Examiner*—Quang Van
(74) *Attorney, Agent, or Firm*—Darby & Darby

(57) ABSTRACT

A plasma emitter apparatus and method for using the same that includes a primary electrode and a secondary electrode. The secondary electrode is porous, that is, it is configured to permit the passage of plasma discharge therethrough. Accordingly, the plasma is received at one side of the secondary electrode and emitted from its opposing plasma exiting side. The secondary electrode may be a laminate of multiple insulating material layers with at least one conductive layer sandwiched therebetween. A plurality of apertures are defined through the laminate and a dielectric sleeve is inserted into and retained in the aperture. The generated plasma passes through one or more holes defined in each of the dielectric sleeves. Alternatively, the secondary electrode may be formed as a plurality of unidirectional high voltage wires strung substantially parallel across a frame or a plurality of bidirectional high voltage wires interwoven and secured by a perimeter frame.

49 Claims, 4 Drawing Sheets

U.S. PATENT DOCUMENTS

| | | |
|---|---|---|
| 4,147,522 A | 4/1979 | Gonas et al. |
| 4,357,151 A | 11/1982 | Helfritch et al. |
| 4,643,876 A | 2/1987 | Jacobs et al. |
| 4,698,551 A | 10/1987 | Hoag ........................ 313/619 |
| 4,756,882 A | 7/1988 | Jacobs et al. |
| 4,818,488 A | 4/1989 | Jacob |
| 4,885,074 A | 12/1989 | Susko et al. ................ 204/298 |
| 4,898,715 A | 2/1990 | Jacob |
| 4,931,261 A | 6/1990 | Jacob |
| 5,033,355 A | 7/1991 | Goldstein et al. ................ 89/8 |
| 5,062,708 A | 11/1991 | Liang et al. ................ 356/316 |
| 5,084,239 A | 1/1992 | Moulton et al. |
| 5,115,166 A | 5/1992 | Campbell et al. |
| 5,178,829 A | 1/1993 | Moulton et al. |
| 5,184,046 A | 2/1993 | Campbell |
| 5,186,893 A | 2/1993 | Moulton et al. |
| 5,288,460 A | 2/1994 | Caputo et al. |
| 5,325,020 A | 6/1994 | Campbell et al. |
| 5,376,332 A | 12/1994 | Martens et al. |
| 5,387,842 A | 2/1995 | Roth et al. |
| 5,408,160 A | 4/1995 | Fox |
| 5,413,758 A | 5/1995 | Caputo et al. |
| 5,413,759 A | 5/1995 | Campbell et al. |
| 5,413,760 A | 5/1995 | Campbell et al. |
| 5,414,324 A * | 5/1995 | Roth et al. ............... 315/111.21 |
| 5,451,368 A | 9/1995 | Jacob |
| 5,472,664 A | 12/1995 | Campbell et al. |
| 5,476,501 A | 12/1995 | Stewart et al. ............... 607/127 |
| 5,482,684 A | 1/1996 | Martens et al. |
| 5,498,526 A | 3/1996 | Caputo et al. |
| 5,549,735 A | 8/1996 | Coppom |
| 5,593,476 A | 1/1997 | Coppom |
| 5,593,550 A | 1/1997 | Stewart et al. ............... 204/164 |
| 5,593,649 A | 1/1997 | Fisher et al. |
| 5,594,446 A | 1/1997 | Vidmar et al. .................. 342/1 |
| 5,603,895 A | 2/1997 | Martens et al. |
| 5,620,656 A | 4/1997 | Wensky et al. |
| 5,637,198 A | 6/1997 | Breault |
| 5,645,796 A | 7/1997 | Caputo et al. |
| 5,650,693 A | 7/1997 | Campbell et al. |
| 5,667,753 A | 9/1997 | Jacobs et al. |
| 5,669,583 A | 9/1997 | Roth |
| 5,686,789 A | 11/1997 | Schoenbach et al. |
| 5,695,619 A | 12/1997 | Williamson et al. |
| 5,733,360 A | 3/1998 | Feldman et al. |
| 5,753,196 A | 5/1998 | Martens et al. |
| 5,872,426 A | 2/1999 | Kunhardt et al. ........... 313/582 |
| 5,939,829 A | 8/1999 | Schoenbach et al. |
| 6,005,349 A | 12/1999 | Kunhardt et al. |
| 6,007,742 A | 12/1999 | Czernichowski et al. |
| 6,016,027 A | 1/2000 | DeTemple et al. |
| 6,027,616 A | 2/2000 | Babko-Malyi ............... 204/164 |
| 6,113,851 A | 9/2000 | Soloshenko et al. |
| 6,146,724 A | 11/2000 | Roth |
| 6,147,452 A | 11/2000 | Kunhardt et al. ........... 313/582 |
| 6,170,668 B1 | 1/2001 | Babko-Malyi et al. |
| 6,228,330 B1 | 5/2001 | Herrmann et al. |
| 6,232,723 B1 | 5/2001 | Alexeff |
| 6,245,126 B1 | 6/2001 | Feldman et al. ................ 95/59 |
| 6,245,132 B1 | 6/2001 | Feldman et al. ................ 96/28 |
| 6,255,777 B1 | 7/2001 | Kim et al. |
| 6,322,757 B1 | 11/2001 | Cohn et al. ............ 422/186.04 |
| 6,325,972 B1 | 12/2001 | Jacobs et al. |
| 6,333,002 B1 | 12/2001 | Jacobs et al. |
| 6,365,102 B1 | 4/2002 | Wu et al. |
| 6,365,112 B1 | 4/2002 | Babko-Malyi et al. |
| 6,372,192 B1 | 4/2002 | Paulauskas et al. ....... 423/447.1 |
| 6,375,832 B1 | 4/2002 | Eliasson et al. ............ 208/141 |
| 6,383,345 B1 | 5/2002 | Kim et al. |
| 6,395,197 B1 | 5/2002 | Detering et al. ............ 252/373 |
| 6,399,159 B1 | 6/2002 | Grace et al. ................ 427/536 |
| 6,433,480 B1 | 8/2002 | Stark et al. |
| 6,451,254 B1 | 9/2002 | Wang et al. |
| 6,458,321 B1 | 10/2002 | Platt, Jr. et al. |
| 6,475,049 B1 | 11/2002 | Kim et al. |
| 6,497,839 B1 | 12/2002 | Kasegawa et al. |
| 6,509,689 B1 | 1/2003 | Kim et al. |
| 6,545,411 B1 | 4/2003 | Kim et al. |
| 6,548,957 B1 | 4/2003 | Kim et al. |
| 6,570,172 B1 | 5/2003 | Kim et al. |
| 6,580,217 B1 | 6/2003 | Kim et al. |
| 6,589,481 B1 | 7/2003 | Lin et al. |
| 6,599,471 B1 | 7/2003 | Jacobs et al. |
| 6,627,150 B1 | 9/2003 | Wang et al. |
| 6,632,323 B1 * | 10/2003 | Kim et al. ............. 156/345.43 |
| 6,635,153 B1 | 10/2003 | Whitehead |
| 6,673,522 B1 | 1/2004 | Kim et al. |
| 6,685,523 B1 | 2/2004 | Kim et al. |
| 6,818,193 B1 | 11/2004 | Christodoulatos et al. |
| 2001/0031234 A1 | 10/2001 | Christodoulatos et al. |
| 2002/0011203 A1 | 1/2002 | Kim |
| 2002/0011770 A1 | 1/2002 | Kim et al. |
| 2002/0045396 A1 | 4/2002 | Kim |
| 2002/0092616 A1 | 7/2002 | Kim |
| 2002/0105259 A1 | 8/2002 | Kim |
| 2002/0105262 A1 | 8/2002 | Kim |
| 2002/0122896 A1 * | 9/2002 | Kim et al. .................. 427/569 |
| 2002/0124947 A1 | 9/2002 | Kim |
| 2002/0126068 A1 | 9/2002 | Kim et al. |
| 2002/0127942 A1 | 9/2002 | Kim et al. |
| 2002/0139659 A1 | 10/2002 | Yu et al. |
| 2002/0144903 A1 | 10/2002 | Kim et al. |
| 2002/0148816 A1 | 10/2002 | Jung et al. |
| 2002/0187066 A1 | 12/2002 | Yu et al. |
| 2003/0003767 A1 | 1/2003 | Kim et al. |
| 2003/0015505 A1 | 1/2003 | Yu et al. |
| 2003/0035754 A1 | 2/2003 | Sias et al. |
| 2003/0048240 A1 | 3/2003 | Shin et al. |
| 2003/0048241 A1 | 3/2003 | Shin et al. |
| 2003/0062837 A1 | 4/2003 | Shin et al. |
| 2003/0070760 A1 | 4/2003 | Kim et al. |
| 2003/0071571 A1 | 4/2003 | Yu et al. |
| 2003/0085656 A1 | 5/2003 | Kunhardt et al. |
| 2003/0127984 A1 | 7/2003 | Kim et al. |
| 2003/0134506 A1 | 7/2003 | Kim et al. |
| 2003/0141187 A1 | 7/2003 | Sohn et al. |
| 2004/0022673 A1 | 2/2004 | Protic |

FOREIGN PATENT DOCUMENTS

| | | |
|---|---|---|
| EP | 1 378 253 A1 | 1/2004 |
| WO | 0144790 | 6/2001 |
| WO | WO-01/44790 A1 | 6/2001 |
| WO | WO-02/49767 A1 | 6/2002 |

OTHER PUBLICATIONS

Stark, et al., "Direct Current Glow Discharges in Atmospheric Air", American Institute of Aeronautics and Astronautics, 30th Plasmadynamics and Lasers Conference: AIAA-99-3666 (Jun. 28-Jul. 1, 1999), pp. 1-5.

Babko-Malyi, Sergei, "Ion-drift Reactor Concept", *Fuel Processing Technology* (1999), pp. 231-246.

Vidmar, R.J., "On the Use of Atmospheric Pressure Plasmas as Electromagnetic Reflectors and Absorbers", *IEEE Transactions on Plasma Science*, vol. 18 No. 4, Aug. 1990; pp. 733-741.

Kunhardt, E.E., "Generation of Large-Volume, Atmospheric-Pressure, Nonequilibrium Plasmas", *IEEE Transactions on Plasma Science*, vol. 28 No. 1, pp. 189-200, Feb. 2000.

Penetrante et al., "Non-Thermal Plasma Techniques for Abatement of Violatile Organic Compounds and Nitrogen Oxides", *INP Report XIII*, pp. 18-46, (1996).

Chen D.C.C., Lawton, J., and Weinberg, F.J., Augmenting Flumes with Electric Discharges. *Tenth Symposium (Int'l) on Combustion*, pp. 743-754, (1965).

Becker, K. v. Tarnovsky, V., *Plasma Sources Science and Technology*, vol. 4, pp. 307-315, (1995).

Knight, Henry de Boyne, The Arc Discharge; Its Application to Power Control, London *Chapman & Hall* , (1960).

L.A. Rosenthal and D.A. Davis, "Electrical Characterization of a Corona Discharge for Surface Treatment", *IEEE Transactions on Industry Applications*, vol. 1A-11, No. 3, pp. 328-335, (May/Jun. 1975).

S. Han, Y. Lee, H. Kim, J. Lee, J. Yoon, and G. Kim, "Polymer Surface Modification by Plasma Source Ion Implantation", *Surfaces and Coatings Technology*, vol. 93, pp. 261-264, (1997).

Kolman et al., "Genotoxic effects of ethylene oxide, propylene oxide and epichlorohydrin in humans: update review" (1990-2001), Mutation Research 512 (2002) 173-194.

Schoenbach, K. et al., "Special Issue on Nonthermal Medical/Biological Treatments Using Electromagnetic Fields and Ionized Gases", IEEE Transactions on Plasma Science, vol. 28, No. 1, Feb. 2000; pp. 2-4.

Jacobs, Paul T., "STERRAD 100S" Sterilization System; Advanced Sterilization Products.

S. Harpless et al. "Interaction of Organophosphonates with $0(^3P)$, $N(^4S)$, $)2(a^1$ g), and $O_3$", Non-Thermal Plasma Techniques or Pollution control, Nato ASI Series, Series G vol. 34, Part A, p. 123-137(1993).

Paur, "Removal of Volatile Hydrocarbons From Industrial Off-Gas", Non-Thermal Nato ASI Series, vol. G34 Part B, p. 77-89, (1993).

Mizuno et al. "Application of Corona Technology in the Reduction of Greenhouse Gases and Other Gaseous Pollutants", Non-Thermal Plasma Techniques for Pollution Control, Nato ASI Series G vol. 34 Part B, 165-185 (1993).

Yamamoto et al., "Decomposition of Volatile Organic Compounds By a Packed-Bed Reactor and a Pulsed-Corona Plasma Reactor", Non-Thermal Plasma Techniques for Pollution Control, Nato ASI Series, G, vol. 34, Part B, p. 223-237, (1993).

Rosocha et al., "Treatment of Hazardous Organic Wastes Using Silent Discharge Plasmas", Non-Thermal Plasma Techniques for Pollution Control, Nato ASI Series G vol. 34 Part B, p. 281-308, (1993).

Christ, Jr., Buckley, "Leak Testing of Tank Linings by High Voltage Discharge", ElectroTechnic Products, Inc. Guide for Using Company's Probes, (1993).

Lawton, James, et al., Electrical Aspects of Combustion, Clarendon Press, Oxford, (1969).

Tarnovsky, V., et al., "Electron-impact ionization of atoms, molecules, ions and transient species", Plasma Sources Science and Technology, vol. 4, pp. 307-315, (1995).

Broer, S., Th. Hammer, Romheld, M., "Treatment of Diesel-Engine Exhaust by Silent Discharge Plasma" INP Report XIII, (1996).

Vidmar, R. J., "On the Use of Atmospheric Pressure Plasmas as Electromagnetic Reflectors and Absorbers", IEEE Transactions on Plasma Science, vol. 18, No. 4, Aug. 1990.

Kunhardt, E. E., "Generation of Large-Volume, Atmospheric-Pressure, Nonequilibrium Plasmas", IEEE Transactions on Plasma Science, vol. 28, No. 1, pp. 189-200, Feb. 2000.

Becker, Kurt H., et al., "Collisional and radiative processes in high-pressure discharge plasmas", Physics of Plasmas, vol. 9, No. 5, pp. 2399-2404, (May 2002).

Chen, D.C.C., et al., "Augmenting Flames with Electric Discharges", Tenth Symposium on Combustion, pp. 734-754, (1965).

Penetrante et al., "Non-Thermal Plasma Techniques for Abatement of Volatile Organic Compoudns and Nitrogen Oxides", INP Report XIII, pp. 18-46, (1996).

Rosenthal, L.A., et al., "Electrical Characterization of a Corona Discharge for Surface Treatment", IEEE Transaction on Industry Applications, vol. 1A-11, No. 3, pp. 328-335, (May/Jun. 1975).

Han, S., et al., "Polymer Surface Modification by Plasma Source Ion Implantation", Surfaces & Coatings Technology, vol. 93, pp. 261-264, (1997).

Kolman, Ada, et al., "Genotoxic effects of ethylene oxide, poroylene oxide and epichlorohydrin in humans: update review (1990-2001)", Mutation Research 512, pp. 173-194, (2002).

Schoenbach, Karl, et al., "Special Issue on Nonthermal Medical/Biological Treatments Using Electromagnetic Fields and Ionized Gases", IEEE Transactions on Plasma Science, vol. 28, No. 1, pp. 2-5, (Feb. 2000).

Jacobs, Paul T., Sterrad 100S Sterilization System Advanced Sterilization Procucts literature, p. 1-17, (1999).

Sharpless, R.L., et al., "Interaction of Organophosphonates with O(3P), N(4S), OS(A1G), and O3", vol. A, p. 123-137 of NATO ASI Series G, vol. 34, Penetrante, B.M. and Schultheis S.E., ed., (1992).

Paur, H.R., "Removal of Volatile Hydrocarbons from Industrial Off-Gas", vol. B, pp. 77-89 of NATO ASI Series G, vol. 34, Penetrante, B.M. and Schultheis S.E., ed., (1992).

Mizuno, A., et al., "Application of Corona Technology in the Reduction of Greenhouse Gases and Other Gaseous Pollutants", vol. B, pp. 165-185 of NATO ASI Series G, vol. 34, Penetrante, B.M. and Schultheis S.E., ed., (1992).

Yamamoto, T., et al., "Decomposition of Volatile Organic Compounds by a Packed-Bed and a Pulsed-Corona Plasma Reactor", vol. B, pp. 223-237 of NATO ASI Series G, vol. 34, Penetrante, B.M. and Schultheis S.E., ed., (1992).

Rosocha, L.A., et al., "Treatment of Hazardous Organic Wasets Using Silent Discharge Plasmas", vol. B, pp. 281-308 of NATO ASI Series G, vol. 34, Penetrante, B.M. and Schultheis S.E., ed., (1992).

\* cited by examiner

ELECTRODE FOR USE WITH ATMOSPHERIC PRESSURE PLASMA EMITTER APPARATUS AND METHOD FOR USING THE SAME

This application claims the benefit of U.S. Provisional Application No. 60/302,890, filed Jul. 2, 2001, which is hereby incorporated by reference.

BACKGROUND OF THE INVENTION

1. Field of the Invention

The present invention is directed to a novel electrode for use with atmospheric pressure plasma emitter apparatus and method for using the same and, in particular, to a plasma emitter apparatus in which the plasma generated passes beyond the secondary electrode.

2. Description of Related Art

A "plasma" is a partially ionized gas composed of ions, electrons, and neutral species. This state of matter is produced by relatively high temperatures or relatively strong electric fields either constant (DC) or time varying (e.g., RF or microwave) electromagnetic fields. Discharged plasma is produced when free electrons are energized by electric fields in a background of neutral atoms/molecules. These electrons cause atom/molecule collisions which transfer energy to the atoms/molecules and form a variety of species which may include photons, metastables, atomic excited states, free radicals, molecular fragments, monomers, electrons, and ions. The neutral gas becomes partially or fully ionized and is able to conduct currents. The plasma species are chemically active and/or can physically modify the surface of materials and may therefore serve to form new chemical compounds and/or modify existing compounds. Discharge plasma can also produce useful amounts of optical radiation to be used for lighting. Many other uses for plasma discharge are available.

Heretofore, conventional plasma discharge reactors, for example, that disclosed in U.S. Pat. No. 5,872,426, have been designed to include an upper electrode plate and a lower electrode plate displaced a predetermined distance therefrom to form a channel therebetween in which the plasma is generated. Both electrode plates are solid prohibiting the passage of the plasma therethrough so that the plasma is restricted to the channel defined between the two electrodes. As a result, the surface of the object to be treated by the plasma must be passed through the channel itself thereby severely limiting the size of the object to be treated to have a width less than that of the channel.

It is desirable to solve the aforementioned problems associated with conventional reactors and develop a portable plasma emitter apparatus and method for using the same that allows the plasma to pass through or beyond the second electrode.

SUMMARY OF THE INVENTION

The present invention is directed to an plasma emitter (reactor) device that solves the aforementioned problems associated with conventional plasma reactor devices.

In particular, the invention relates to a plasma emitter apparatus and method for using the same that includes a primary electrode and a secondary electrode. The secondary electrode is porous, that is, it is configured to permit the passage of plasma therethrough. Accordingly, the plasma is received at one side of the secondary electrode and emitted from its opposing side. Numerous configurations of the secondary electrode are possible so long as it permits the passage of plasma therethrough. For instance, the secondary electrode may be a laminate of multiple insulating material layers with a conductive layer sandwiched therebetween. A plurality of apertures are defined through the laminate and a dielectric sleeve is inserted into and retained in the aperture. The generated plasma passes through the dielectric sleeves. Alternatively, the secondary electrode may be formed as a plurality of unidirectional conductive wires/slats arranged substantially parallel to one another within a frame or a plurality of bidirectional conductive wires/slats interwoven and secured by a frame. Since the plasma passes through the secondary electrode the plasma reactor device may be positioned proximate to or in direct contact with the surface to be treated.

In one embodiment the present invention is directed to a plasma emitter apparatus including a primary dielectric and a primary electrode disposed proximate the primary dielectric. A secondary electrode is at a voltage potential different from that of the voltage potential of the primary electrode so as to produce a plasma discharge. The secondary electrode is configured to permit passage of the plasma discharge therethrough. Specifically, the secondary electrode has a first surface facing the primary electrode and an opposing plasma exiting surface forming at least a portion of one surface of a housing enclosing the primary electrode and dielectric. The plasma discharge is emitted from the plasma exiting surface of the secondary electrode.

Another embodiment of the invention relates to a plasma emitter apparatus having a primary dielectric having an aperture defined therethrough and a primary electrode disposed proximate to the primary dielectric. A secondary electrode is disposed about at least a portion of the outer perimeter of the primary dielectric. The primary and second electrodes are at different voltage potentials to produce a plasma discharge.

Also disclosed as part of the invention is a method for generating a plasma discharge using a plasma emitter apparatus configured in any of the embodiments described above.

BRIEF DESCRIPTION OF DRAWINGS

The foregoing and other features of the present invention will be more readily apparent from the following detailed description and drawings of illustrative embodiments of the invention wherein like reference numbers refer to similar elements throughout the several views and in which.

DETAILED DESCRIPTION OF THE INVENTION

Figure 1:
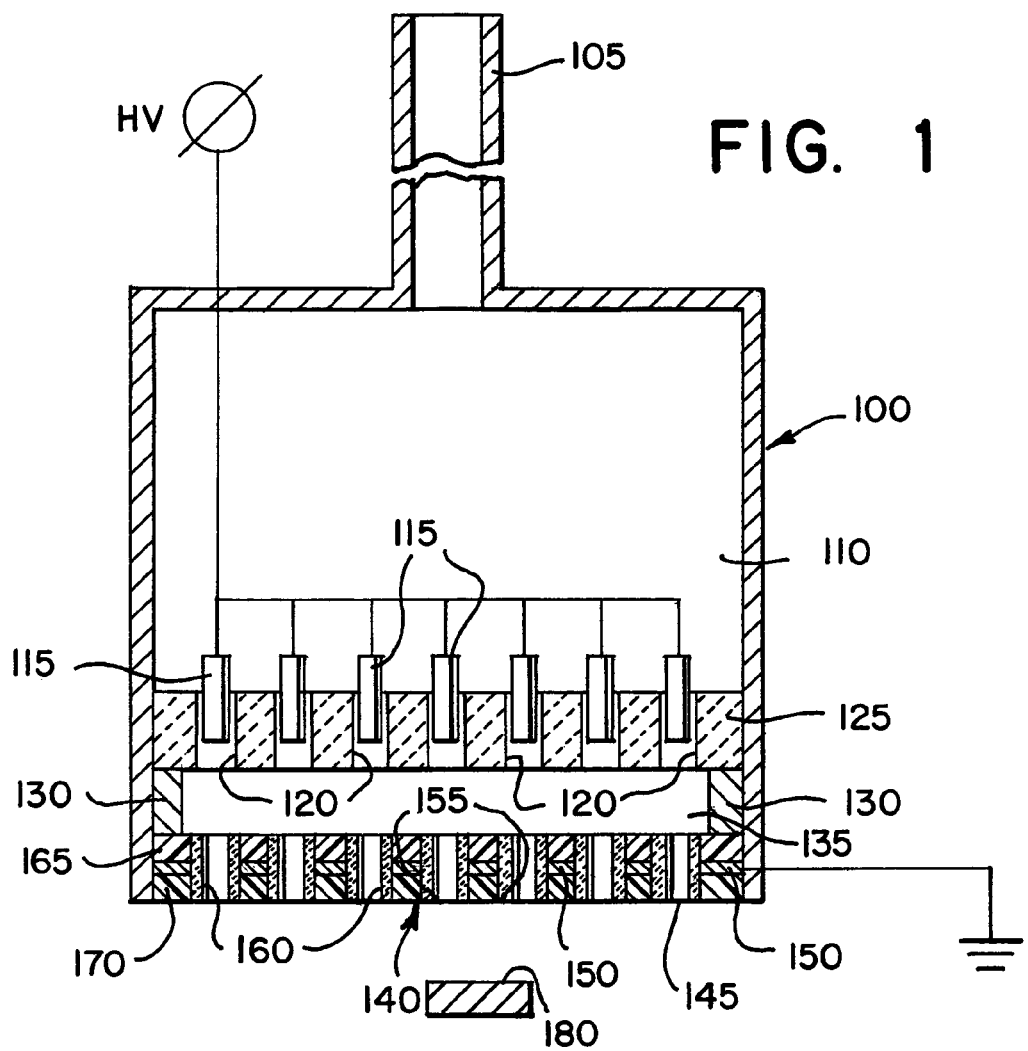
FIG. 1 is a cross-sectional view of an exemplary first embodiment of a plasma emitter apparatus in accordance with the present invention.

An exemplary embodiment of the plasma emitter apparatus 100 in accordance with the present invention is shown in FIG. 1. By way of illustrative example, the plasma emitter apparatus 100 has a square lateral cross-sectional shape, however, any desired geometric shape is contemplated and within the intended scope of the invention. Moreover, the dimensions of the plasma emitter apparatus 100 may be varied, as desired, to suit the particular application and overall cost.

The plasma emitter apparatus 100 is portable and may be readily guided over a surface to be treated using the handle 105. The body includes a manifold or chamber 110 disposed above a primary dielectric 125. In the example shown in FIG. 1, the primary dielectric 125 has a plurality of capillaries 120 defined therethrough. A primary electrode 115 is partially inserted into each of the respective capillaries 120 and connected to a high voltage source. By way of example, the primary electrode is segmented, that is, a solid pin having a blunt end is partially inserted into respective capillaries 120. Such configuration is described in detail in pending U.S. patent application Ser. No. 09/738,923, filed on Dec. 15, 2000, which is herein incorporated by reference in its entirety. Other configurations of the primary electrode 115 are contemplated. For instance, the pin may have a hollow passageway therethrough to permit the passage of a carrier gas and/or may have a tapered instead of a blunt end. Alternatively, the segmented primary electrode need not extend into the capillary 120 at all and thus may be configured as a ring or washer disposed proximate or in contact with the opening of the capillary 120. The foregoing description is for a first dielectric with capillaries and a segmented electrode. Instead of using a capillary segmented electrode discharge, a corona or plate discharge may be substituted. The configuration of the primary electrode and dielectric may be modified, as desired, and is not essential to the present invention.

The primary dielectric 125 preferably is displaced a predetermined distance from a secondary or opposing electrode 140 by, for example, a spacer 130 such as an O-ring, to form a pocket 135 therebetween. The pocket 135 may be used to receive an auxiliary agent such as a carrier gas, e.g., helium gas, and has the dual advantage that the air contained therein contributes to the overall dielectric of the reactor. Spacer 130 may be eliminated altogether so that the secondary electrode 150 is in contact with the primary dielectric. Secondary electrode 150 is connected to a voltage having a potential, e.g., ground, different from that of the primary electrode 115 so as to create a voltage potential differential between the two electrodes.

Figure 2:
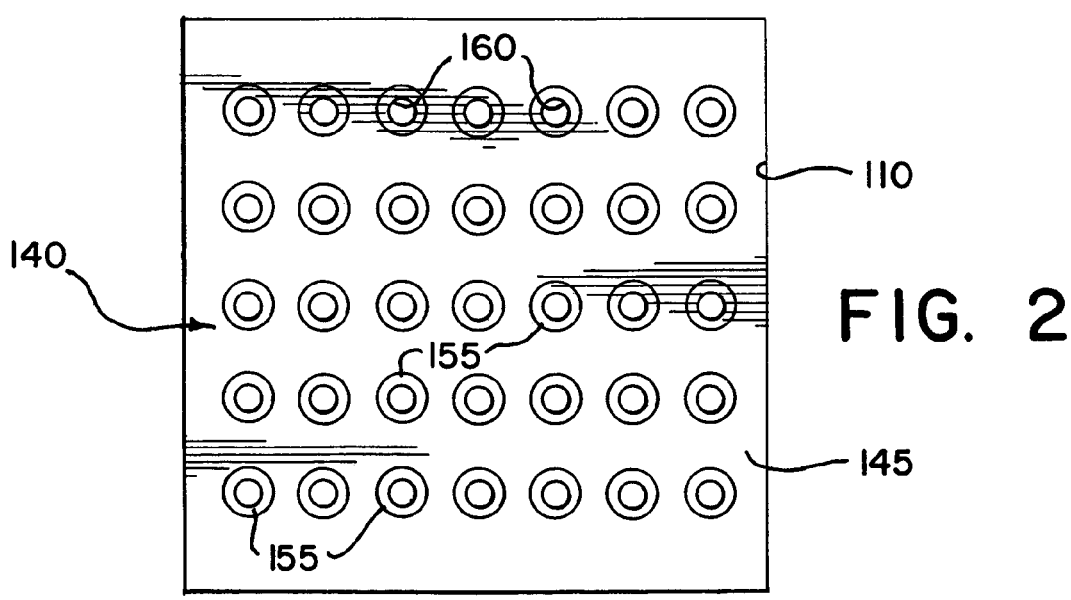
FIG. 2 is a bottom view of the exemplary secondary electrode of the plasma emitter apparatus of FIG. 1.

FIG. 2 is a bottom plan view of the plasma exiting surface 145 of the exemplary secondary electrode 140 of FIG. 1. The secondary electrode 140 is manufactured by laminating at least one conductive layer 150 between two dielectric layers 165, 170 (e.g., Teflon plates). One or more apertures are defined through the laminated assembly to receive a secondary dielectric 155 made, for example, of alumina, quartz, Pyrex, or any other insulating material. The geometric configuration of the secondary dielectric 155 may be modified, as desired, so long as it permits the passage of plasma therethrough. One preferred configuration is to design the secondary dielectric 155 in the shape of a ring or sleeve having an outer diameter that is approximately equal to the inner diameter of the aperture so as to permit the ring or sleeve 155 to be inserted and retained in the aperture. At least one bore 160 is defined through each sleeve 155 to permit passage of the plasma discharge. The number of bores defined in each sleeve need not be uniform. By way of example, FIG. 2 shows a secondary electrode 140 with 35 bores 160. It is, however, within the present scope of the present invention to modify the design, as desired, to include any number of one or more bores configured in any desired arrangement or pattern. Moreover, the apertures and sleeves to be inserted therein may, but need not be, uniform in diameter and/or spacing relative to each other. In addition, the laminated assembly used to form the secondary dielectric is shown in the example in FIG. 1 to include a single conductive layer 150, however, more than one conductive layer may be used, as desired.

In a preferred embodiment, the plasma emitter apparatus is arranged so that the center of the capillaries 120 defined in the primary electrode 115 and the center of the associated bore 160 in the secondary dielectric 155 are substantially aligned. Plasma, generated due to the voltage differential between the primary and secondary electrodes 115, 150, passes through the capillaries 120 defined in the primary dielectric 125 and is received in the corresponding associated bores 160 defined in the secondary dielectric 155 embedded in the laminate assembly secondary electrode 140. While passing through the bore 160, the plasma discharge diffuses within the bores 160 towards the conductive layer 150 connected to ground. As a result, the plasma discharge emitted from the exiting surface 145 of the reactor assumes substantially the shape and size of the inner perimeter of the respective bores 160 and thus covers a wider surface area to be treated.

Figure 3:
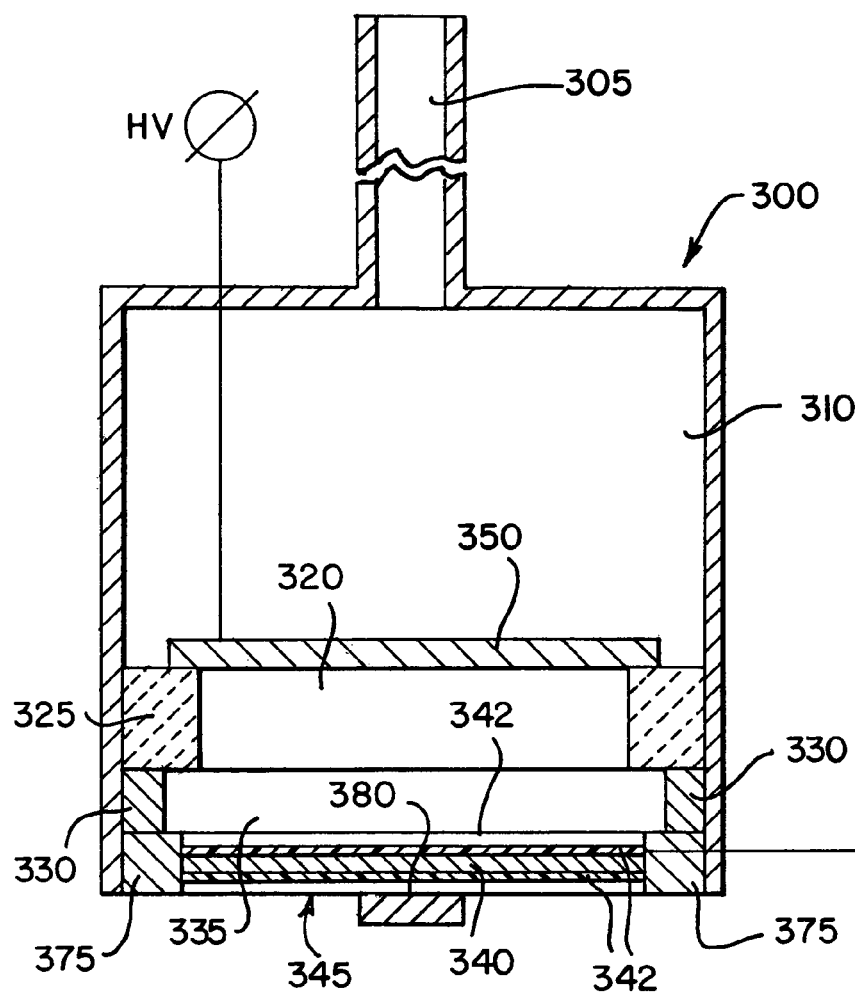
FIG. 3 is a cross-sectional view of an exemplary second embodiment of a plasma emitter apparatus in accordance with the present invention.
Figure 4:
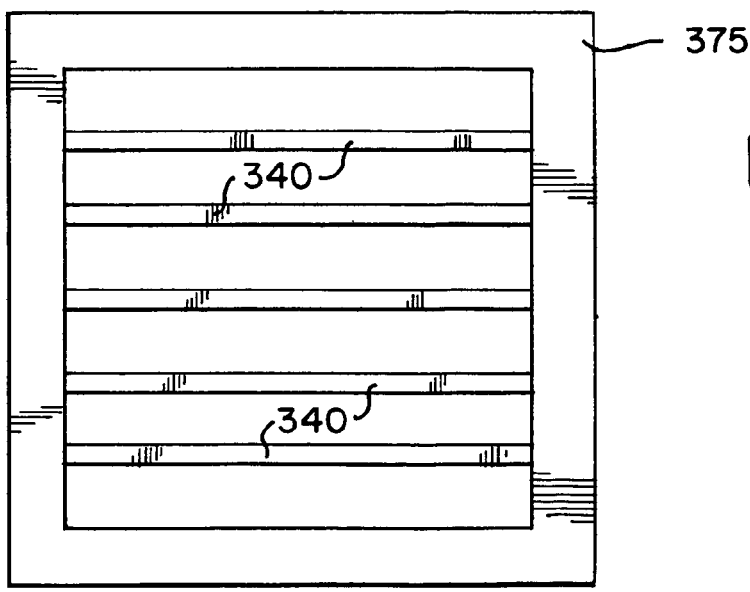
FIG. 4 is a bottom view of the exemplary secondary electrode of the plasma emitter apparatus of FIG. 3.

An alternative second embodiment of the plasma emitter apparatus in accordance with the present invention is shown in FIGS. 3 and 4 (hereinafter referred to as a "unidirectional wire secondary electrode" configuration). This alternative embodiment is particular well suited for use with a slot discharge primary electrode configuration, as described in U.S. Provisional Application Ser. No. 60/358,340, filed on Feb. 19, 2002, which is herein incorporated by reference in its entirety. This primary electrode configuration differs from that of the capillary configuration of the first embodiment in that a substantially rectangular slot 320 is defined in the primary dielectric 325. In this configuration the plasma discharge emanating from the slot 320 in the primary dielectric 325 disperses and covers a wider area in the pocket 335. In the slot discharge primary electrode configuration, instead of using a laminated plate with holes defined therein, as shown in FIGS. 1 and 2, the secondary electrode is constructed of one or more conductive wires or slats 340 (e.g., high voltage wires) insulated with a dielectric material and arranged substantially parallel to one another and secured on a frame 375 (FIG. 4). In this embodiment, neither the width nor spacing between adjacent wires or slats need be uniform.

Preferably, the slot 320 defined in the primary dielectric 325 is disposed substantially centered between two adjacent secondary wire/slat electrodes 340 encased within a dielectric insulation 342. Plasma generated due to the voltage differential between the primary and secondary electrodes 350, 340, respectively, passes through the slots 320 defined in the primary dielectric 325 and diffuses towards the secondary wire/slat electrodes 340 disposed on either side of the slot discharge. A substantially linear and disperse area of plasma is generated by this configuration thereby covering more surface area than the capillary segmented discharge of FIGS. 1 and 2. Aside from the slot discharge configuration for the primary electrode and dielectric, barrier and corona discharge configurations are also suited for this embodiment.

Figure 5:
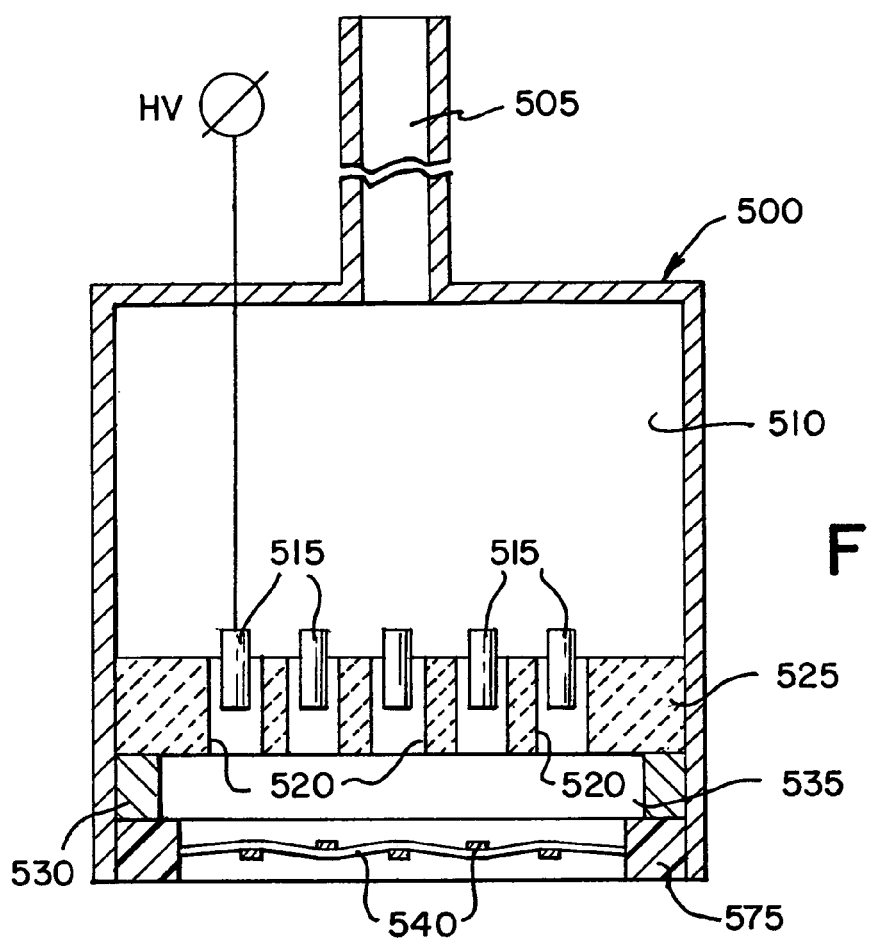
FIG. 5 is a cross-sectional view of an exemplary third embodiment of a plasma emitter apparatus in accordance with the present invention.
Figure 6:
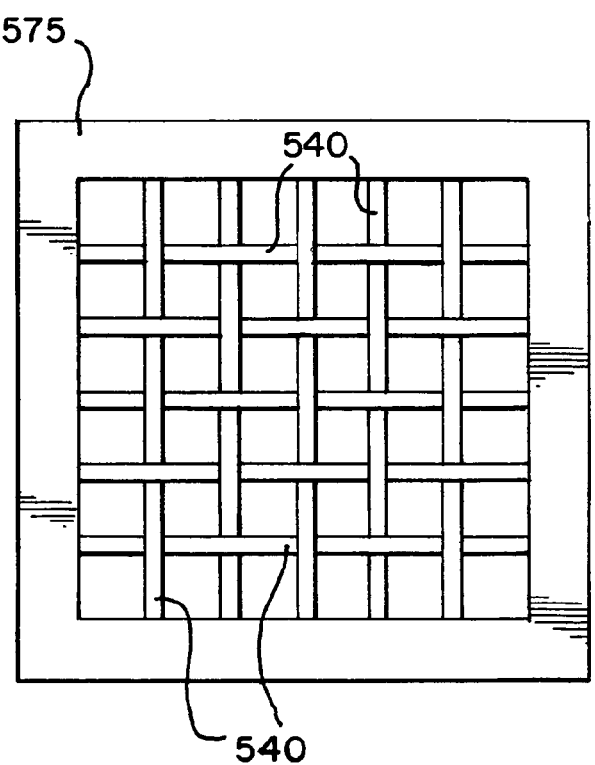
FIG. 6 is a bottom view of the exemplary secondary electrode of the plasma emitter apparatus of FIG. 5.

FIGS. 5 and 6 show an exemplary third embodiment of the plasma emitter apparatus in accordance with the present invention (hereinafter referred to as a "bidirectional wire weave secondary electrode" configuration). This third embodiment differs from that of the second embodiment in that the wires or slats are disposed in at least two directions. In a preferred embodiment, the wires or slats forming the secondary electrode 540 are disposed substantially perpendicular to one another and interwoven to form a weave. Alternatively, the secondary electrode maybe formed by a plurality of wires or slates (e.g., high voltage wires) secured at their intersections to form a "wire-mesh-like" grid and then coated with an insulating material. It has been found that the use of the wire-mesh-like grid (instead of being interweaved) results in a non-uniform distribution of dielectric constant after covering or dipping the mesh into a dielectric liquid. Specifically, thicker buildup of dielectric material occurs at the intersections which increases breakdown at thinner (non-intersection) locations. A more uniform coverage and dielectric constant is realized when the bidirectional wires or slats are interwoven. In a preferred embodiment, the primary and secondary dielectrics are disposed so that the center of the primary electrodes 515 are substantially centered with the center of the corresponding associated substantially square geometric shape formed by the intersecting wires/slats 540.

Like the first embodiment shown in FIGS. 1 and 2, the third embodiment shown in FIGS. 5 and 6 is shown and described with a capillary segmented primary electrode discharge. Once again, other configurations of the primary electrode and dielectric 515, 525 are within the intended scope of the invention. For instance, the pin may have a hollow passageway therethrough to permit the passage of a carrier gas and/or may have a tapered end. Alternatively, the segmented electrode 515 need not extend into the capillary 520 at all and thus may be configured as a ring or washer disposed proximate or in contact with the opening of the capillary 520. Instead of using a capillary segmented discharge configuration for the primary electrode and dielectric, a corona or plate discharge may be substituted. The configuration of the primary electrode and dielectric may be modified, as desired, and is not essential to the present invention.

Figure 7:
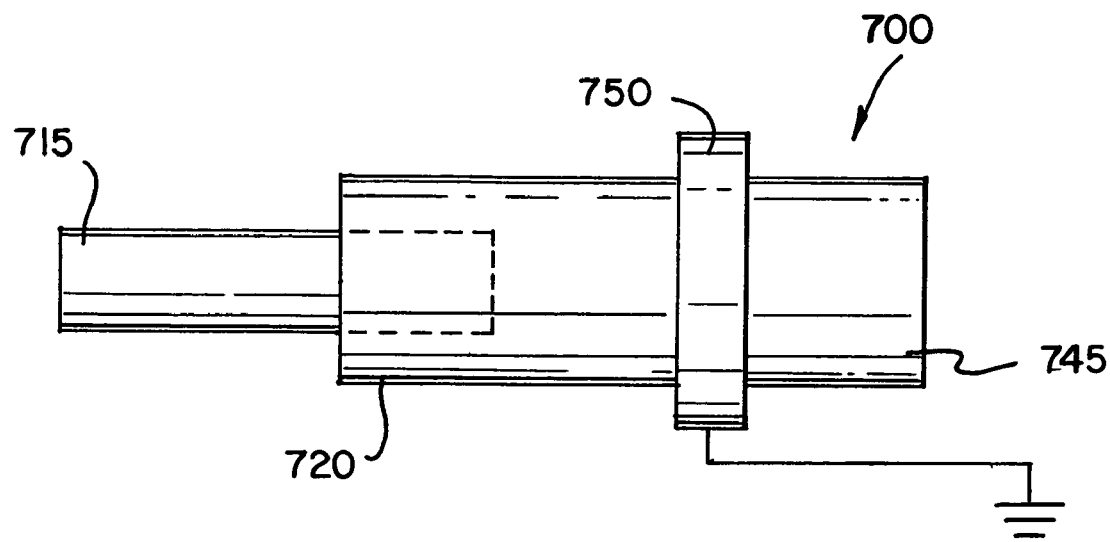
FIG. 7 is a side view of an exemplary fourth embodiment of a plasma emitter apparatus in accordance with the present invention.
Figure 8:
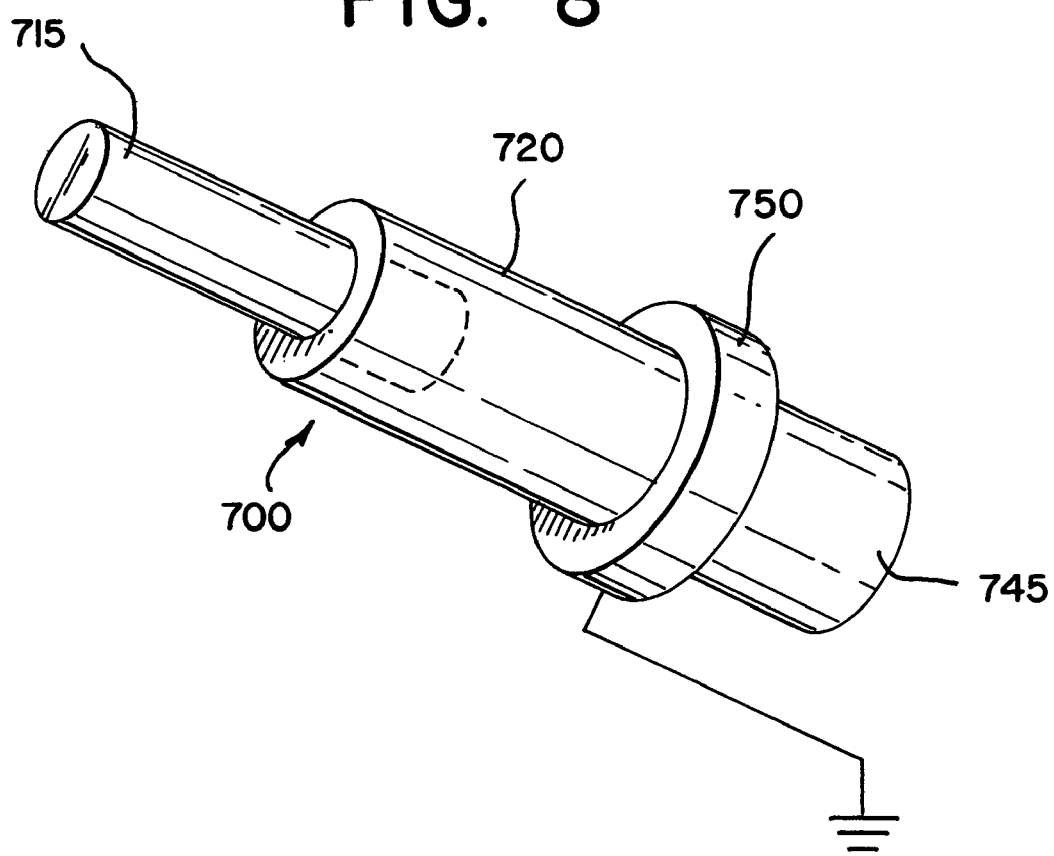
FIG. 8 is a perspective view of the plasma emitter apparatus in FIG. 7.

FIGS. 7 and 8 are exemplary side and perspective views, respectively, of yet another embodiment of the plasma emitter apparatus in accordance with the present invention. By way of example only a single capillary is shown, however, it is understood that the reactor may be readily designed to include more than one capillaries. A primary electrode 715 is inserted partially into the capillary 720. Disposed about the outer diameter of the capillary 720 is a secondary electrode 750 in the shape of a ring or washer. There is a voltage differential between the primary and secondary electrodes 715, 750 that produces a plasma discharge within the capillary 720. While in the capillary 720 the plasma is drawn towards the secondary electrode 750 due to its lower voltage thereby diffusing the plasma discharge towards the interior perimeter of the capillary 720. Accordingly, the plasma discharge is emitted from the exiting surface 745 of the plasma reactor 700 over a greater surface area to be treated.

The advantages of the present inventive plasma emitter apparatus will now be described with respect to the particular application of surface cleaning or treating of an object or liquid. Heretofore, with conventional plasma reactors the plasma discharge is generated in a channel formed between the primary and secondary dielectrics. Thus, the surface to be treated or cleaned had to pass within the channel thereby severely prohibiting treatment of surfaces on objects larger in size than the width of the channel.

In contrast, plasma discharge passes through and emanates from the second electrode in the present inventive plasma emitter apparatus. Accordingly, in operation the surface to be treated and the object itself need not be passed through a gap limited to a predetermined width. Instead, the surface to be treated need merely be positioned proximate or in direct contact with the plasma exiting surface of the plasma emitter apparatus independent of the size of the object itself. If the plasma exiting surface of the plasma emitter apparatus is placed in direct contact with the surface to be treated 180 (as shown in FIG. 1) then the surface is bombarded with both electrons and free radicals. This is particularly well suited for such applications as cleaning and etching. On the other hand, if the plasma emitter apparatus is held so that the plasma exiting surface is displaced a predetermined distance, i.e., greater than zero (not in contact with), away from the surface of the object to be treated 380 (as shown in FIG. 3) then the surface being treated will be bombarded with only free radicals. This alternative embodiment is adapted for such applications as a light source, to increase the surface tension, sterilization, and/or cleaning. Typically, surface treatment is for an object, but the present inventive reactor may be used in the treatment of the surface of a liquid or to treat a contaminated gas.

Another advantage of the plasma emitter apparatus is that multiple surfaces of a 3-dimensional object may be treated without the need to move or rotate the object itself. To do so, the user merely alters the direction of the plasma exiting surface of the plasma emitter apparatus so as to be proximate or in contact with each surface of the object to be treated.

Thus, the construction of the plasma emitter apparatus in accordance with the present invention is advantageous in that the plasma discharge, i.e., the radicals and/or electrons, pass through and beyond the second electrode. As a result, the object of which a surface is to be treated need no longer be constrained in size to the predetermined width of the gap of the channel formed between the first dielectric and the secondary electrodes, as found in conventional plasma reactor devices.

Numerous applications may be found for the plasma emitter apparatus in accordance with the present invention. One typical application is the use of the plasma emitter apparatus to clean and/or sterilize a surface of an object or a liquid, or to treat a contaminated gas. Another application is to use the apparatus as a light source. Yet another application is to provide surface chemistry and controlled oxidation by bombardment of the free radicals and/or electrons generated by the plasma reactor device. These are but a few illustrative examples of the use of the plasma emitter apparatus in accordance with the present invention and are not meant to limit in scope in any way additional contemplated applications not expressly disclosed herein. Although the invention has been described with respect to the surface of a solid object it should also be noted that the plasma emitter apparatus may be used to treat liquids and gases as well.

Thus, while there have been shown, described, and pointed out fundamental novel features of the invention as applied to a preferred embodiment thereof, it will be understood that various omissions, substitutions, and changes in the form and details of the devices illustrated, and in their operation, may be made by those skilled in the art without departing from the spirit and scope of the invention. For example, it is expressly intended that all combinations of those elements and/or steps which perform substantially the same function, in substantially the same way, to achieve the same results are within the scope of the invention. Substitutions of elements from one described embodiment to another are also fully intended and contemplated. It is also to be understood that the drawings are not necessarily drawn to scale, but that they are merely conceptual in nature. It is the intention, therefore, to be limited only as indicated by the scope of the claims appended hereto.

All patents, patent applications, publications, procedures, and the like which are cited in this application are hereby incorporated by reference.

What is claimed is:

1. A plasma emitter apparatus, comprising:
a primary dielectric;
a primary electrode disposed proximate said primary dielectric, said primary electrode being at a first voltage potential, said primary dielectric associated with the primary electrode;
a secondary electrode being at a second voltage potential different from that of the first voltage potential so as to produce a plasma discharge, said secondary electrode permitting passage of the plasma discharge therethrough, said secondary electrode having a first surface facing said primary electrode and a secondary opposing surface of said secondary electrode, wherein said secondary electrode includes a plurality of unidirectional conductive layers disposed substantially parallel to one another; and
secondary dielectrics, associated with each of the plurality of unidirectional conductive layers, so that said secondary electrode is not exposed.

2. The plasma emitter apparatus in accordance with claim 1, wherein said secondary electrode further includes a second plurality of unidirectional conductive layers interwoven with the plurality of unidirectional conductive layers.

3. A plasma emitter apparatus, comprising:
a housing;
a primary dielectric disposed within said housing;
a primary electrode disposed proximate said primary dielectric, said primary dielectric associated with the primary electrode;
a secondary electrode having a first surface facing said primary electrode and a secondary opposing surface forming at least a portion of one surface of said housing, the primary and second electrodes being at different voltages so as to generate a plasma discharge that is emitted from the secondary opposing surface of said secondary electrode; and
a secondary dielectric, associated with the secondary electrode, so that said secondary electrode is not exposed.

4. The plasma emitter apparatus in accordance with claim 3, wherein said secondary electrode is a laminate comprising two dielectric layers with a conductive layer disposed therebetween, at least one aperture is defined in said laminate, a dielectric sleeve is disposed within each respective aperture with a hole defined therein.

5. The plasma emitter apparatus in accordance with claim 4, wherein said primary dielectric has at least one capillary defined therethrough.

6. The plasma emitter apparatus in accordance with claim 5, wherein said primary dielectric is arranged relative to said secondary dielectric so that the center of each of the capillaries is substantially aligned with the center of each respective hole.

7. The plasma emitter apparatus in accordance with claim 3, wherein said secondary electrode is a plurality of unidirectional conductive wires disposed substantially parallel to one another and secured within a frame.

8. The plasma emitter apparatus in accordance with claim 7, wherein said primary dielectric has at least one slot defined therethrough.

9. The plasma emitter apparatus in accordance with claim 8, wherein said primary dielectric is arranged relative to said secondary electrode such that each slot is disposed substantially centered between two adjacent wires.

10. The plasma emitter apparatus in accordance with claim 3, wherein said secondary electrode is a plurality of unidirectional conductive slats disposed substantially parallel to one another and secured within a frame.

11. The plasma emitter apparatus in accordance with claim 10, wherein said primary dielectric has at least one slot defined therethrough.

12. The plasma emitter apparatus in accordance with claim 11, wherein said primary dielectric is arranged relative to said secondary electrode such that each slot is disposed substantially centered between two adjacent conductive slats.

13. The plasma emitter apparatus in accordance with claim 3, wherein said secondary electrode comprises a plurality of bidirectional conductive wires interwoven in a substantially perpendicular configuration to form a grid, said bidirectional conductive wires being secured within a frame.

14. The plasma emitter apparatus in accordance with claim 13, wherein said primary dielectric has at least one capillary defined therethrough.

15. The plasma emitter apparatus in accordance with claim 14, wherein said primary dielectric is arranged relative to said secondary dielectric so that a center of each of the capillaries is substantially aligned with a center of each of a plurality of squares formed by overlapping of the bidirectional conductive wires.

16. The plasma emitter apparatus in accordance with claim 3, wherein said secondary electrode is a plurality of bidirectional conductive slats interwoven in a substantially perpendicular configuration to form a grid, said bidirectional conductive slats being secured within a frame.

17. The plasma emitter apparatus in accordance with claim 16, wherein said primary dielectric has at least one capillary defined therethrough.

18. The plasma emitter apparatus in accordance with claim 17, wherein said primary dielectric is arranged relative to said secondary dielectric so that a center of each of the capillaries is substantially aligned with a center of each of a plurality of squares formed by overlapping of the bidirectional conductive slats.

19. The plasma emitter apparatus in accordance with claim 3, further comprising a spacer disposed between said first and second dielectrics to displace the second dielectric a predetermined distance relative to said first dielectric.

20. A method for producing a plasma discharge using a plasma emitter apparatus including a primary dielectric; a primary electrode disposed proximate said primary dielectric, said primary dielectric associated with the primary electrode; a secondary electrode, said secondary electrode includes a plurality of unidirectional conductive layers disposed substantially parallel to one another and has a first surface facing said primary electrode and an opposing surface, the primary and secondary electrodes being at different voltages; and a secondary dielectric, associated with each of the plurality of unidirectional conductive layers, so that said secondary electrode is not exposed, said method comprising the step of:

producing a plasma discharge that passes through said secondary electrode.

21. The method in accordance with claim 20, wherein said producing step comprises applying a differential in potential voltage between said primary and secondary electrodes to generate the plasma discharge.

22. The method in accordance with claim 20, wherein said secondary electrode is a laminate comprising two dielectric layers with a conductive layer disposed therebetween, at least one aperture is defined in said laminate, and a dielectric sleeve is disposed within each respective aperture with a hole defined therein.

23. The method in accordance with claim 22, wherein said primary dielectric has at least one capillary defined therethrough.

24. The method in accordance with claim 23, wherein said primary dielectric is arranged relative to said secondary dielectric so that a center of each of the capillaries is substantially aligned with a center of each respective hole.

25. The method in accordance with claim 20, wherein said secondary electrode is a plurality of unidirectional conductive wires disposed substantially parallel to one another and secured within a frame.

26. The method in accordance with claim 25, wherein said primary dielectric has at least one slot defined therethrough.

27. The method in accordance with claim 26, wherein said primary dielectric is arranged relative to said secondary electrode such that each slot is disposed substantially centered between two adjacent wires.

28. The method in accordance with claim 20, wherein said secondary electrode is a plurality of unidirectional conductive slats disposed substantially parallel to one another and secured within a frame.

29. The method in accordance with claim 28, wherein said primary dielectric has at least one slot defined therethrough.

30. The method in accordance with claim 29, wherein said primary dielectric is arranged relative to said secondary electrode such that each slot is disposed substantially centered between two adjacent conductive slats.

31. The method in accordance with claim 30, wherein said secondary electrode is a plurality of bidirectional conductive wires interwoven in a substantially perpendicular configuration to form a grid, said bidirectional conductive wires being secured within a frame.

32. The method in accordance with claim 31, wherein said primary dielectric has at least one capillary defined therethrough.

33. The method in accordance with claim 32, wherein said primary dielectric is arranged relative to said second dielectric so that the center of each of the capillaries is substantially aligned with the center of each square formed by overlapping of the bidirectional conductive wires.

34. The method in accordance with claim 20, wherein said secondary electrode is a plurality of bidirectional conductive slats interwoven in a substantially perpendicular configuration to form a grid, said bidirectional conductive slats being secured within a frame.

35. The method in accordance with claim 34, wherein said primary dielectric has at least one capillary defined therethrough.

36. The method in accordance with claim 35, wherein said primary dielectric is arranged relative to said second dielectric so that the center of each of the capillaries is substantially aligned with the center of each square formed by overlapping of the bidirectional conductive slats.

37. The method in accordance with claim 20, wherein said plasma emitter apparatus further comprising a spacer disposed between said first and second dielectrics to displace the second dielectric a predetermined distance relative to said first dielectric.

38. The method in accordance with claim 20, wherein said primary dielectric has an aperture defined therethrough, said primary electrode is disposed proximate said primary dielectric, and said secondary electrode is disposed about at least a portion of the outer perimeter of said primary dielectric.

39. The method in accordance with claim 38, wherein said primary electrode is a pin inserted at least partially into the aperture, and said secondary electrode is a washer made of conductive material disposed about the circumference of said primary dielectric.

40. The method in accordance with claim 20, further comprising the step of passing the plasma discharge through the plasma exiting surface of said secondary electrode.

41. The method in accordance with claim 40, further comprising the step of placing the plasma emitter apparatus so that the exiting surface of said secondary electrode is proximate to a surface to be treated.

42. The method in accordance with claim 40, further comprising the step of placing the plasma emitter apparatus so that the exiting surface of said secondary electrode is in direct contact with a surface to be treated.

43. A plasma emitter apparatus, comprising:
a primary dielectric;
a primary electrode disposed proximate said primary dielectric, said primary electrode being at a first voltage potential, said primary dielectric associated with the primary electrode;
a secondary electrode being at a second voltage potential different from that of the first voltage potential so as to produce a plasma discharge, said secondary electrode permitting passage of the plasma discharge therethrough, wherein the secondary electrode is a plurality of unidirectional conductive wires disposed substantially parallel to one another and secured within a frame; and
a secondary dielectric, associated with the secondary electrode, so that said secondary electrode is not exposed.

44. A plasma emitter apparatus, comprising:
a primary dielectric;
a primary electrode disposed proximate said primary dielectric, said primary electrode being at a first voltage potential, said primary dielectric associated with the primary electrode;
a secondary electrode being at a second voltage potential different from that of the first voltage potential so as to produce a plasma discharge, said secondary electrode permitting passage of the plasma discharge therethrough, wherein said secondary electrode is a plurality of unidirectional conductive slats disposed substantially parallel to one another and secured within a frame; and
a secondary dielectric, associated with the secondary electrode, so that said secondary electrode is not exposed.

45. A method for producing a plasma discharge using a plasma emitter apparatus including a primary dielectric; a primary electrode disposed proximate said primary dielectric, the primary dielectric associated with the primary electrode; a secondary electrode formed by a plurality of unidirectional conductive wires disposed substantially parallel to one another and secured within a frame, the primary and secondary electrodes being at different voltages; and a secondary dielectric, associated with the secondary electrode, so that said secondary electrode is not exposed, said method comprising the step of:

producing a plasma discharge that passes through said secondary electrode.

46. A method for producing a plasma discharge using a plasma emitter apparatus including a primary dielectric; a primary electrode disposed proximate said primary dielectric, the primary dielectric associated with the primary electrode; a secondary electrode formed by a plurality of unidirectional conductive slats disposed substantially parallel to one another and secured within a frame, the primary and secondary electrodes being at different voltages; and a secondary dielectric, associated with the secondary electrode, so that said secondary electrode is not exposed, said method comprising the step of:

producing a plasma discharge that passes through said secondary electrode.

47. A method of producing plasma discharge using a plasma emitter apparatus including a housing; a primary dielectric disposed within said housing; a primary electrode disposed proximate said primary dielectric, said primary dielectric associated with the primary electrode; a secondary electrode having a first surface facing said primary electrode and a secondary opposing surface forming at least a portion of one surface of said housing, the primary and second electrodes being at different voltages so as to generate a plasma discharge that is emitted from the secondary opposing surface of said secondary electrode; and a secondary dielectric, associated with the secondary electrode, so that said secondary electrode is not exposed, said method comprising the step of producing a plasma discharge that passes through said secondary electrode.

48. The method in accordance with claim 47, wherein said secondary electrode is a plurality of bidirectional conductive wires interwoven in a substantially perpendicular configuration to form a grid, said bidirectional conductive wires being secured within a frame.

49. The method in accordance with claim 47, wherein said secondary electrode is a plurality of bidirectional conductive slats interwoven in a substantially perpendicular configuration to form a grid, said bidirectional conductive slats being secured within a frame.

* * * * *